(12) United States Patent
Srinivasan et al.

(10) Patent No.: US 8,634,224 B2
(45) Date of Patent: Jan. 21, 2014

(54) MEMORY CELLS, NON-VOLATILE MEMORY ARRAYS, METHODS OF OPERATING MEMORY CELLS, METHODS OF WRITING TO AND READING FROM A MEMORY CELL, AND METHODS OF PROGRAMMING A MEMORY CELL

(75) Inventors: Bhaskar Srinivasan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 510 days.

(21) Appl. No.: 12/855,624

(22) Filed: Aug. 12, 2010

(65) Prior Publication Data

US 2012/0039109 A1 Feb. 16, 2012

(51) Int. Cl.
*G11C 11/00* (2006.01)

(52) U.S. Cl.
USPC ............... 365/148; 365/51; 365/46; 365/174

(58) Field of Classification Search
USPC .......... 365/148.51, 189.011, 189.15, 189.16, 365/148, 51, 46, 174
See application file for complete search history.

(56) References Cited

U.S. PATENT DOCUMENTS

| | | | |
|---|---|---|---|
| 4,094,008 A | 6/1978 | Lockwood et al. | |
| 4,242,736 A | 12/1980 | Raffel et al. | |
| 4,947,376 A | 8/1990 | Arimoto et al. | |
| 5,161,121 A | 11/1992 | Cho | |
| 5,736,420 A | 4/1998 | Min et al. | |
| 5,917,744 A * | 6/1999 | Kirihata et al. | 365/63 |
| 6,380,056 B1 | 4/2002 | Shue et al. | |
| 6,518,589 B2 * | 2/2003 | King | 257/6 |
| 6,559,470 B2 * | 5/2003 | Tsu-Jae | 257/17 |
| 6,657,882 B2 | 12/2003 | Takashima | |
| 6,670,659 B1 | 12/2003 | Gudesen et al. | |
| 6,887,792 B2 | 5/2005 | Perlov et al. | |
| 6,999,854 B2 | 2/2006 | Roth | |

(Continued)

FOREIGN PATENT DOCUMENTS

| | | |
|---|---|---|
| EP | 11742625 | 6/2013 |
| WO | WO 2006/029228 | 3/2006 |

(Continued)

OTHER PUBLICATIONS

Di Ventra et al., "Circuit elements with memory: Memristors, Memcapacitors, and Meminductors" In: Proceedings of the IEEE, vol. 97, Issue 10, pp. 1717-1724, Oct. 2009.

(Continued)

*Primary Examiner* — Viet Q Nguyen
(74) *Attorney, Agent, or Firm* — Wells St. John, P.S.

(57) ABSTRACT

In one aspect, a method of operating a memory cell includes using different electrodes to change a programmed state of the memory cell than are used to read the programmed state of the memory cell. In one aspect, a memory cell includes first and second opposing electrodes having material received there-between. The material has first and second lateral regions of different composition relative one another. One of the first and second lateral regions is received along one of two laterally opposing edges of the material. Another of the first and second lateral regions is received along the other of said two laterally opposing edges of the material. At least one of the first and second lateral regions is capable of being repeatedly programmed to at least two different resistance states. Other aspects and implementations are disclosed.

43 Claims, 8 Drawing Sheets

(56) References Cited

U.S. PATENT DOCUMENTS

| | | | |
|---|---|---|---|
| 7,009,278 B2 | 3/2006 | Hsu | |
| 7,272,060 B1* | 9/2007 | Lu et al. | 365/203 |
| 7,302,513 B2 | 11/2007 | Mouttet | |
| 7,342,413 B2 | 3/2008 | Mouttet | |
| 7,365,382 B2 | 4/2008 | Willer et al. | |
| 7,378,870 B2 | 5/2008 | Mouttet | |
| 7,391,235 B2 | 6/2008 | Mouttet | |
| 7,435,648 B2 | 10/2008 | Hsu et al. | |
| 7,447,828 B2 | 11/2008 | Mouttet | |
| 7,449,354 B2 | 11/2008 | Marchant et al. | |
| 7,459,933 B2 | 12/2008 | Mouttet | |
| 7,564,262 B2 | 7/2009 | Mouttet | |
| 7,576,565 B2 | 8/2009 | Mouttet | |
| 7,609,086 B2 | 10/2009 | Mouttet | |
| 7,626,878 B1* | 12/2009 | Lin et al. | 365/207 |
| 7,696,506 B2* | 4/2010 | Lung | 257/4 |
| 7,755,424 B2 | 7/2010 | Mouttet | |
| 7,902,867 B2 | 3/2011 | Mouttet | |
| 7,983,065 B2 | 7/2011 | Samachisa | |
| 8,094,485 B2* | 1/2012 | Shimakawa et al. | 365/148 |
| 8,183,553 B2 | 5/2012 | Phatak et al. | |
| 8,199,556 B2 | 6/2012 | Srinivasan et al. | |
| 8,223,539 B2* | 7/2012 | Smythe et al. | 365/178 |
| 8,259,489 B2 | 9/2012 | Nagashima et al. | |
| 8,294,219 B2 | 10/2012 | Malhotra et al. | |
| 2001/0019147 A1 | 9/2001 | DeBoer et al. | |
| 2002/0034101 A1 | 3/2002 | Semi | |
| 2003/0179617 A1 | 9/2003 | Gudesen et al. | |
| 2004/0022090 A1 | 2/2004 | Hasegawa et al. | |
| 2004/0065912 A1 | 4/2004 | Liu et al. | |
| 2004/0218441 A1 | 11/2004 | Schwarzl | |
| 2004/0246768 A1 | 12/2004 | Krieger et al. | |
| 2006/0171200 A1 | 8/2006 | Rinerson et al. | |
| 2007/0117315 A1 | 5/2007 | Lai et al. | |
| 2007/0217252 A1 | 9/2007 | Symanczyk | |
| 2007/0229111 A1 | 10/2007 | Mouttet | |
| 2007/0229112 A1 | 10/2007 | Mouttet | |
| 2007/0229121 A1 | 10/2007 | Mouttet | |
| 2007/0231972 A1 | 10/2007 | Mouttet | |
| 2007/0241942 A1 | 10/2007 | Mouttet | |
| 2007/0257704 A1 | 11/2007 | Mouttet | |
| 2008/0001172 A1 | 1/2008 | Karg et al. | |
| 2008/0048186 A1 | 2/2008 | Cheng et al. | |
| 2008/0059688 A1 | 3/2008 | Mouttet | |
| 2008/0106926 A1 | 5/2008 | Brubaker et al. | |
| 2008/0172385 A1 | 7/2008 | Mouttet | |
| 2008/0212382 A1 | 9/2008 | Mouttet | |
| 2008/0222342 A1 | 9/2008 | Mouttet | |
| 2008/0246116 A1 | 10/2008 | Mouttet | |
| 2008/0307151 A1 | 12/2008 | Mouttet | |
| 2009/0026435 A1 | 1/2009 | Kakegawa | |
| 2009/0122602 A1 | 5/2009 | Takemura et al. | |
| 2009/0163826 A1 | 6/2009 | Mouttet | |
| 2009/0244953 A1 | 10/2009 | Maejima | |
| 2009/0279343 A1 | 11/2009 | Chang et al. | |
| 2009/0289290 A1 | 11/2009 | Huang et al. | |
| 2010/0034010 A1 | 2/2010 | Xi et al. | |
| 2010/0078620 A1 | 4/2010 | Xi et al. | |
| 2011/0051310 A1 | 3/2011 | Strachan et al. | |
| 2011/0186801 A1 | 8/2011 | Yang et al. | |
| 2011/0199814 A1 | 8/2011 | Meade | |
| 2011/0199815 A1 | 8/2011 | Meade | |
| 2011/0240941 A1 | 10/2011 | Pickett et al. | |
| 2011/0261606 A1* | 10/2011 | Sandhu et al. | 365/148 |
| 2011/0266515 A1 | 11/2011 | Pickett et al. | |
| 2012/0012809 A1 | 1/2012 | Yang et al. | |
| 2012/0014170 A1 | 1/2012 | Strukov et al. | |
| 2012/0032134 A1 | 2/2012 | Yang et al. | |
| 2012/0063192 A1* | 3/2012 | Lee | 365/148 |
| 2012/0104346 A1 | 5/2012 | Yi et al. | |
| 2013/0001498 A1* | 1/2013 | Srinivasan et al. | 257/2 |
| 2013/0002634 A1 | 1/2013 | Wendler et al. | |
| 2013/0082229 A1* | 4/2013 | Chen | 257/4 |
| 2013/0223134 A1* | 8/2013 | Yi et al. | 365/148 |

FOREIGN PATENT DOCUMENTS

| | | |
|---|---|---|
| WO | WO 2010/144092 | 12/2010 |
| WO | WO 2010/147588 | 12/2010 |
| WO | PCT/US2011/022390 | 9/2011 |
| WO | PCT/US2011/023190 | 10/2011 |
| WO | PCT/US2011/043504 | 12/2011 |
| WO | PCT/US2011/022390 | 8/2012 |
| WO | PCT/US2011/023190 | 8/2012 |
| WO | PCT/US2011/043504 | 2/2013 |

OTHER PUBLICATIONS

Lai et al., "Analog memory capacitor based on field-configurable ion-doped polymers" In: Applied Physics Letters, vol. 95, Issue 21, pp. 213503-213503-3, Nov. 2009.

Liu et al., "Electric-pulse-induced Capacitance Change Effect in Perovskite Oxide Thin Films", Journal of Applied Physics, Sep. 2006, vol. 100,. Issue 5, p. 056101.

U.S. Appl. No. 12/705,918, filed Feb. 15, 2010, Meade.

U.S. Appl. No. 12/705,928, filed Feb. 15, 2010, Meade et al.

An Introduction to memimpedance and Memadmittance Systems Analysis; http://knol.google.com/k/an-introduction-to-memimpedance-and-memadmittance-systems-analysis#; 2009; 21 pp.

Biolek et al., "SPICE Modeling of Memristive, Memcapacitative and Memiductive Systems", IEEE; 2009; pp. 249-252.

Chua et al., "Memristive Devices and System", Proceedings of the IEEE, vol. 64, No. 2, Feb. 1976; pp. 209-223.

Chua, "Memristor—The Missing Circuit Element", IEEE Transactions on Circuit Theory, vol. CT-18, No. 5; Sep. 1971; pp. 507-519.

Chua, "Nonlinear Circuit Foundations for Nanodevices, Part I: The Four-Element Torus", IEEE; 2003; pp. 1830-1859.

Di Ventra et al., "Putting Memory Into Circuit Elements", Memristors, Memcapacitors and Meminductors; Aug. 2009; pp. 1371-1372.

Di Ventura et al., "Circuit elements with memory", Memristors, Memcapacitors and Meminductors; Jan. 23, 2009; pp. 1-6.

HP Memristor FAQ; http://www.hpl.hp.com/news/2008/apr-jun/memristor_faq.html; Apr. 2008; 3 pp.

Meyer et al., "Oxide Dual-Layer Memory Element for Scalable Non-Volatile Cross-Point Memory Technology", IEEE; 2008; pp. 1-5.

Pershin et al., "Experimental Demonstration of Associative Memory with Memristive Neural Networks", Sep. 18, 2009; pp. 1-5.

Pershin et al., "Memristive Circuits Simulate Memcapacitors and Meminductors", Oct. 8, 2009; pp. 1-2.

Strukov et al., "Coupled Ionic and Electronic Transport Model of Thin-Film Semiconductor Memristive Behavior", Small 2009, 5, No. 9; pp. 1058-1063.

Strukov et al., "Exponential Ionic Drift: Fast Switching and Low Volatility of Thin-Film Memristors", Applied Physics A; Nov. 28, 2008; pp. 515-519.

Strukov et al., "The missing memristor found", vol. 453, Nature Publishing Group; May 1, 2008; pp. 80-83.

The Business Landscape for Memristor Electronics; http://knol.google.com/k/the-business-landscape-for-memristor-electronics#; 2009; 12 pp.

The Mysterious Memristor; http://spectrum.ieee.org/semiconductors/design/the-mysterious-memristor; May 2008; 4 pp.

Wakefield et al., "Titanium Dioxide as Gate Insulator for M.O.S. Transistors", Electronic Letters, vol. 6, No. 16; Aug. 6, 1970; pp. 507-508.

What is a Memristor?; http://www.coolestanswers.com/science-technology/what-is-a-memristor.html; Oct. 19, 2008; 2 pp.

Winkler, et al.: Floating nano-dot MOS capacitor memory arrays without cell transistors; Microelectronic Engineering, Elsevier Publishers BV., Amsterdam, NL, vol. 73-74. Mar. 19, 2004; pp. 719-724.

* cited by examiner

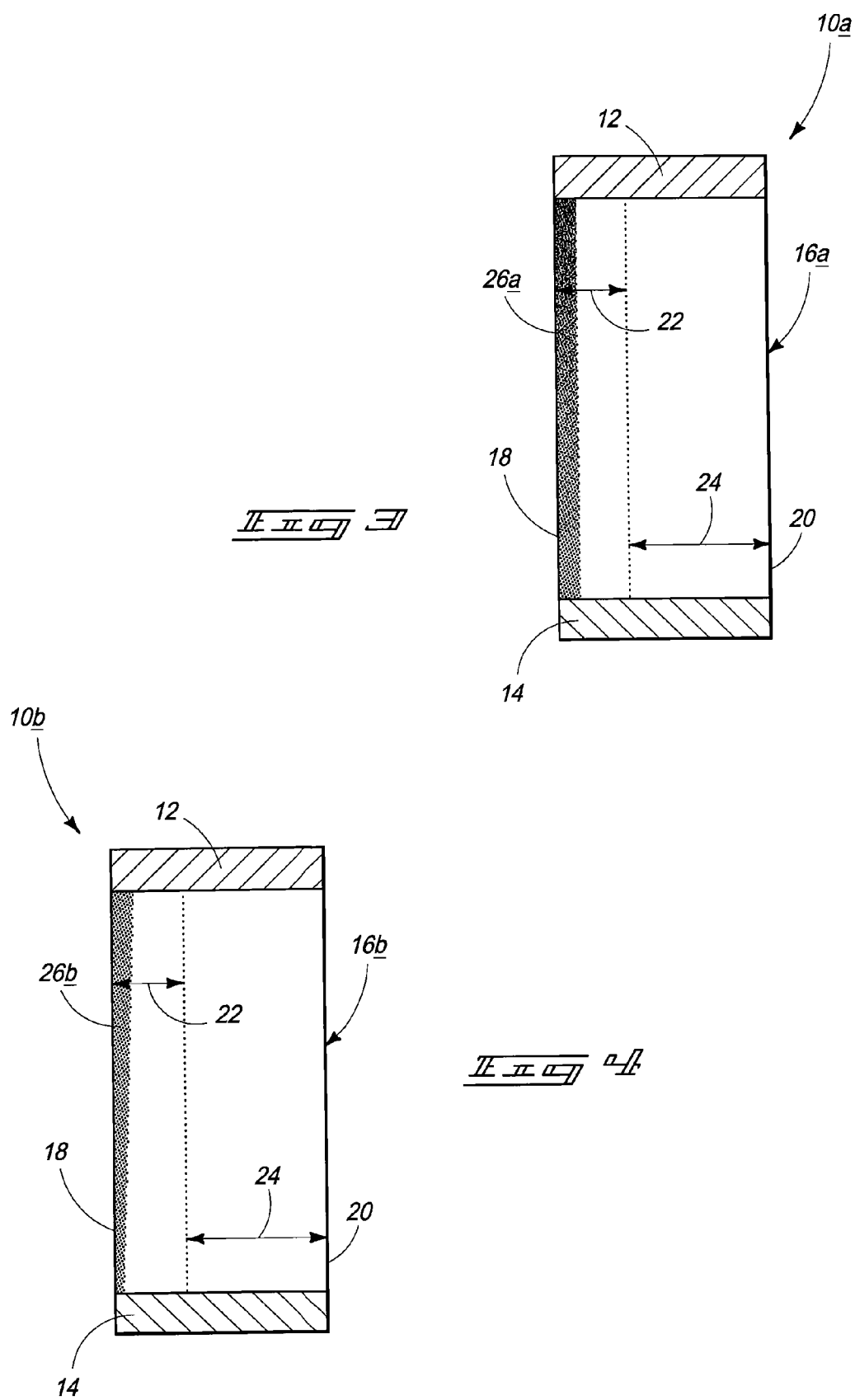

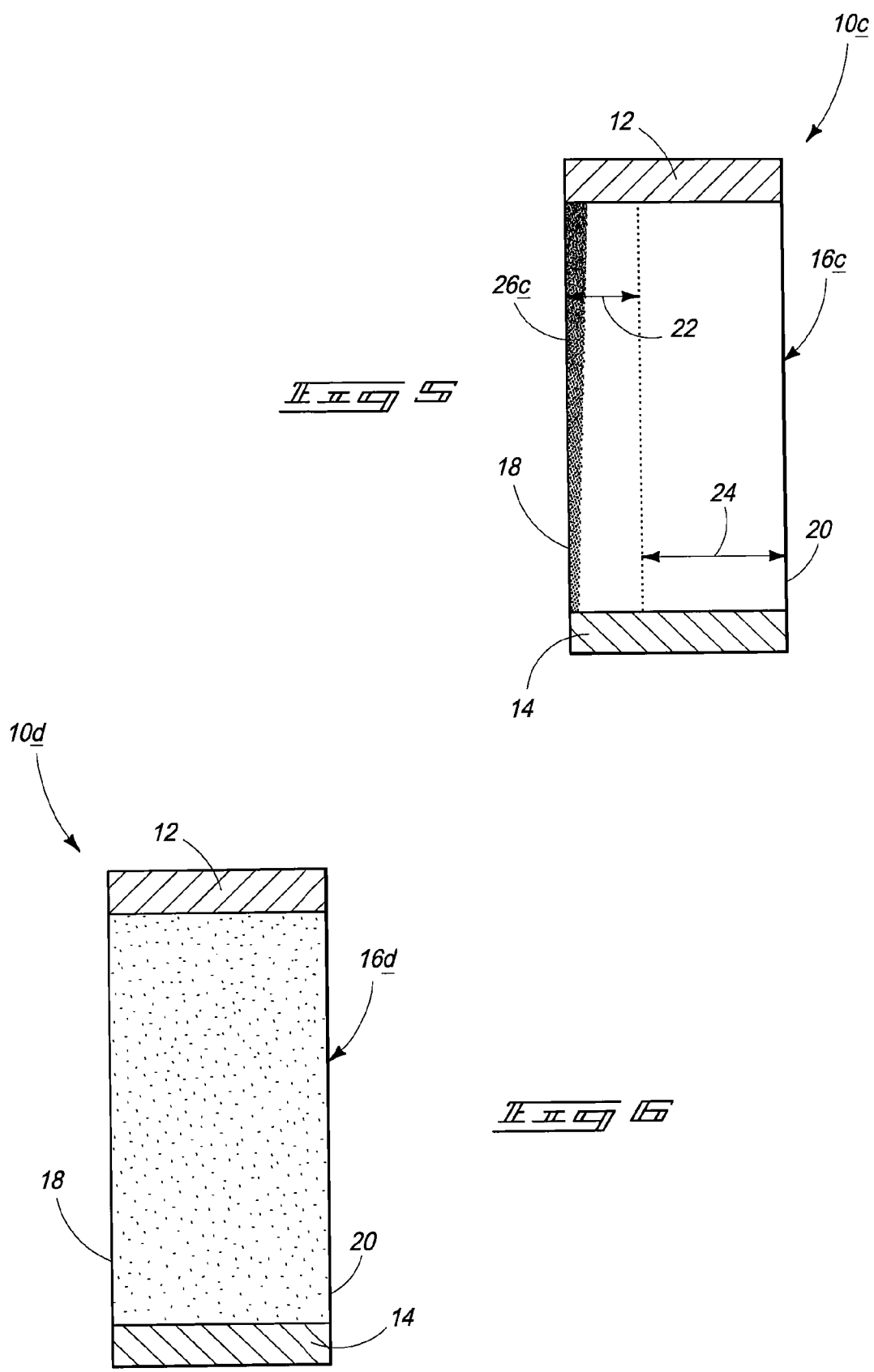

MEMORY CELLS, NON-VOLATILE MEMORY ARRAYS, METHODS OF OPERATING MEMORY CELLS, METHODS OF WRITING TO AND READING FROM A MEMORY CELL, AND METHODS OF PROGRAMMING A MEMORY CELL

TECHNICAL FIELD

Embodiments disclosed herein pertain to memory cells, to non-volatile memory arrays, to methods of operating memory cells, to methods of writing to and reading from a memory cell, and to methods of programming a memory cell.

BACKGROUND

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances when the computer is turned off. Volatile memory dissipates and therefore is required to be refreshed/rewritten, and in many instances multiple times per second. Regardless, the smallest unit in each array is termed as a memory cell and is configured to retain or store memory in at least two different selectable states. In a binary system, the storage conditions are considered as either a "0" or a "1". Further, some individual memory cells can be configured to store more than two bits of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistance states to enable storing of information by an individual memory cell. When configured in one extreme of the resistance states, the material may have a high resistance to electrical current. In contrast in the other extreme, when configured in another resistance state, the material may have a low resistance to electrical current. Existing and yet-to-be developed memory cells might also be configured to have one or more additional possible stable resistance states in between a highest and a lowest resistance state. Regardless, the resistance state in which the programmable material is configured may be changed using electrical signals. For example if the material is in a high-resistance state, the material may be configured to be in a low resistance state by applying a voltage across the material.

The programmed resistance state is designed to be persistent in non-volatile memory. For example, once configured in a resistance state, the material stays in such resistance state even if neither a current nor a voltage is applied to the material. Further, the configuration of the material may be repeatedly changed from one resistance state to another for programming the memory cell into different of at least two resistance states. Upon such programming, the resistance state of the material can be determined by appropriate signals applied to one or both of the two electrodes between which the material is received.

BRIEF DESCRIPTION OF THE DRAWINGS

FIG. 3 is a diagrammatic sectional view of a memory cell in accordance with an embodiment of the invention.
FIG. 4 is a diagrammatic sectional view of a memory cell in accordance with an embodiment of the invention.
FIG. 5 is a diagrammatic sectional view of a memory cell in accordance with an embodiment of the invention.
FIG. 6 is a diagrammatic sectional view of a memory cell in accordance with an embodiment of the invention.

DETAILED DESCRIPTION OF EXAMPLE EMBODIMENTS

One embodiment of the invention is a method of operating a memory cell which uses different electrodes to change a programmed state of the memory cell than are used to read the programmed state of the memory cell. In one embodiment, a method of writing to and reading from a memory cell uses first and second opposing electrodes to read from the memory cell and uses third and fourth opposing electrodes to write to the memory cell, where the first, second, third and fourth electrodes are different electrodes. Existing or yet-to-be developed memory cells might be usable in practice of the above-described methods. Embodiments of the invention also include memory cells independent of operation. Accordingly, methods as described herein are not necessarily limited by memory cell or memory array construction, and memory cell and memory array construction are not necessarily limited to or by methods of operation.

Figure 1:
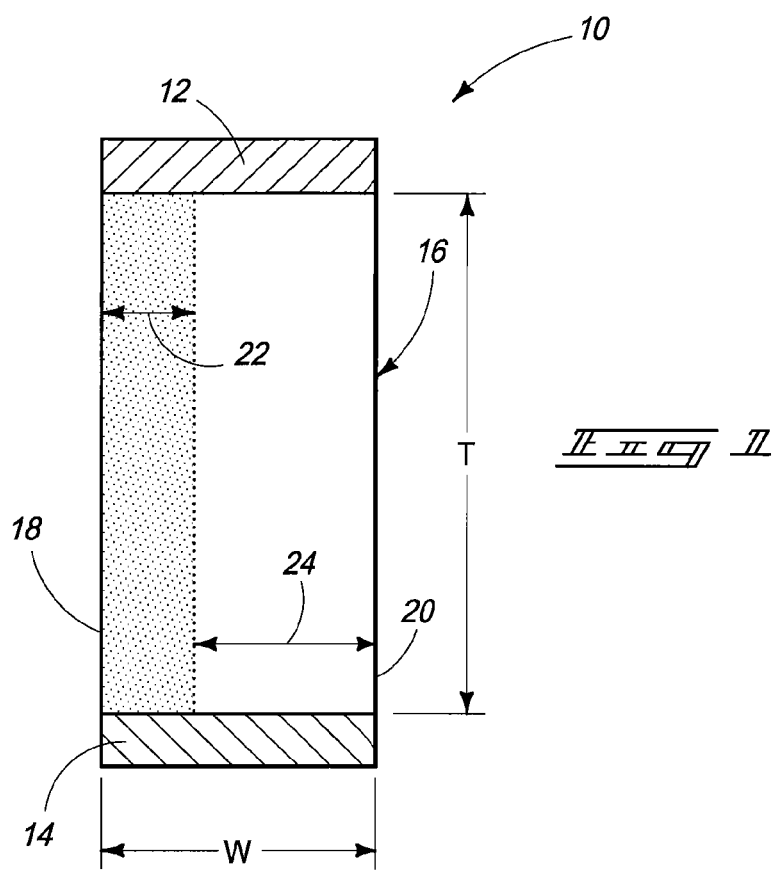
FIG. 1 is a diagrammatic sectional view of a memory cell in accordance with an embodiment of the invention.
Figure 2:
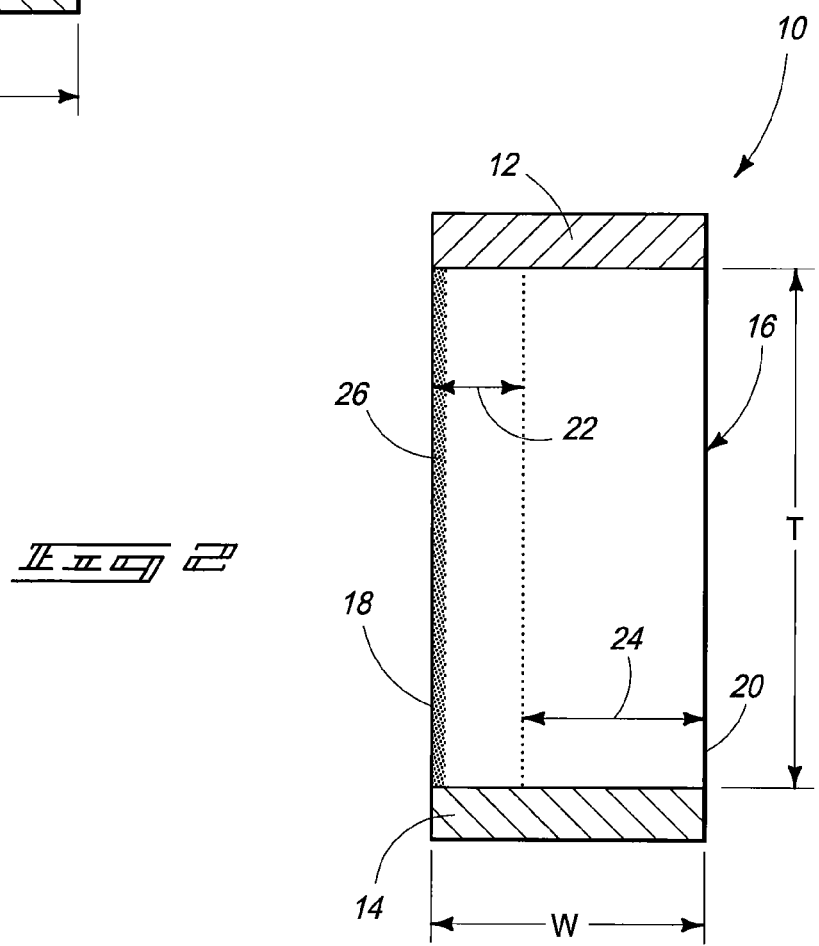
FIG. 2 is a diagrammatic sectional view of a memory cell in accordance with an embodiment of the invention.

Example memory cells which may be operated in accordance with the above methods, as well as other methods which may or may not be disclosed herein, are described initially with reference to FIGS. 1-6. FIGS. 1 and 2 depict a memory cell 10 in two different programmed states, with FIG. 1 being a high resistance state and FIG. 2 being a low resistance state. More than two resistance states may be used. Regardless, the FIG. 1 circuit construction may be considered as an embodiment of the invention and the FIG. 2 circuit construction may be considered as an embodiment of the invention.

Referring to FIG. 1, memory cell 10 comprises a pair of opposing conductive electrodes 12 and 14. In one embodiment, electrodes 12 and 14 may be considered as first and second conductive electrodes. Regardless, electrodes 12 and 14 may be fabricated of any one or more suitable conductive materials, such as elemental metals, alloys of elemental metals, conductive metal compounds, and/or conductively doped semiconductive material. In one embodiment, electrodes 12 and 14 are rectangular in cross section and have respective inwardly opposing faces which are planar and parallel relative one another. Alternately shaped and oriented electrodes may be used, for example shapes which do not provide planar parallel opposing faces relative to one another, and including non-planar faces. FIGS. 1 and 2 also illustrate an example embodiment wherein the conductive electrodes entirely overlap one another. Alternately, a partial overlapping construction may be used.

A material 16 is received between first and second opposing electrodes 12 and 14. Such may be homogenous or non-homogenous at least in the FIG. 1 programmed state. Regardless, material 16 may be considered as having two laterally opposing edges 18, 20. In one embodiment, material 16 comprises resistance switchable material. In one embodiment, material 16 consists essentially of resistance switchable material which is in physical touching contact with one or both of conductive electrodes 12 and 14. As an alternate example, one or more additional materials may be received elevationally between a resistance switchable material and either of conductive electrodes 12 and 14. Such intervening material may or may not be homogenous. Regardless and by way of example, a diode or other functional device or attribute may be provided elevationally intermediate the resistance switchable material and the conductive electrodes.

Material 16 comprises first lateral region 22 and second lateral region 24 which are of different composition relative one another. One of the first and second lateral regions is received along one of the two laterally opposing edges of material 16, and another of the first and second lateral regions is received along the other of the two laterally opposing edges of material 16. In the embodiment of FIGS. 1 and 2, first lateral region 22 is received along edge 18 and second lateral region 24 is received along edge 20. Regardless, lateral regions 22 and 24 may or may not have the same lateral width. Further, the lateral widths of regions 22 and 24 may be respectively constant (as shown) or variable. Regardless, at least one of the first and second lateral regions is capable of being repeatedly programmed to at least two different resistance states. In the embodiments of FIGS. 1 and 2, only one of the first and second regions (first region 22) is capable of being repeatedly programmed to at least two different resistance states.

In one embodiment, lateral region 22 comprises a resistance switchable material. In one embodiment, the resistance switchable material has mobile dopants therein, and in one embodiment the mobile dopants are received within a dielectric. In the context of this document, a "mobile dopant" is a component (other than a free electron) of a surrounding material that is movable to different locations within the surrounding material during normal device operation of repeatedly programming the device between at least two different static resistance states by application of a suitable electric field through the surrounding material. Examples include atom vacancies in an otherwise stoichiometric material and atom interstitials, including metal atoms or ions in glasses such as chalcogenide materials. Specific example mobile dopants include oxygen atom vacancies in amorphous or crystalline oxides or other oxygen-containing material, nitrogen atom vacancies in amorphous or crystalline nitrides or other nitrogen-containing material, fluorine atom vacancies in amorphous or crystalline fluorides or other fluorine-containing material, and interstitial metal atoms or metal ions in amorphous or crystalline oxides or in silicon. Mobile dopants of material 16 are depicted diagrammatically by dots/stippling in the drawings. Density of the dots/stippling in a given area/volume in the drawings indicates degree of mobile dopant density, with more dots/stippling indicating higher mobile dopant density and less dots/stippling indicating lower mobile dopant density. More than one type of mobile dopant may be used as part of material 16.

FIGS. 1 and 2 depict lateral region 22 as comprising mobile dopants and lateral region 24 as not comprising any mobile dopants. Alternately, second lateral region 24 may comprise mobile dopants which may be of the same type of mobile dopants as those in first lateral region 22, and regardless, may be of the same, lesser, or greater density than mobile dopant quantity/density within first lateral region 22. As but one example, mobile dopants might be present in region 24 in an insufficient quantity/density for programming such region into different detectable resistance states in normal operation of the memory cell. FIG. 1 diagrammatically depicts first lateral region 22 and second lateral region 24 being defined by an idealized vertical wall there-between as a line of demarcation of presence of mobile dopants vs. no presence of mobile dopants. Alternately, such line of demarcation may be a lateral region of reducing/increasing density of mobile dopants, and/or such line may not be vertical. Regardless, in one embodiment, first lateral region 22 and second lateral region 24 are of the same composition but for quantity and/or type of mobile dopants therein which results in the inherent composition difference between first lateral region 22 and second lateral region 24.

As example material of lateral region 22, example dielectrics in which mobile dopants may be received include suitable oxides, nitrides, and/or fluorides that are capable of localized electrical conductivity (to be described) based upon sufficiently high quantity and concentration of the mobile dopants. The dielectric within which the mobile dopants are received may or may not be homogenous independent of consideration of the mobile dopants. Specific example dielectrics include $TiO_2$, $HfO_2$, $ZrO_2$, $GeO_x$, $SiO_2$, AlN, and/or $MgF_2$.

In one embodiment, the material of lateral region 22 that comprises oxygen vacancies as mobile dopants may comprise a combination of $TiO_2$ and $TiO_{2-x}$ in at least one programmed state depending on location of the oxygen vacancies and the quantity of the oxygen vacancies in the locations where such are received. In such embodiment, lateral region 24 may or may not comprise $TiO_2$ having lower density of or no oxygen vacancies in comparison to lateral region 22.

In one embodiment, lateral region 22 that comprises nitrogen vacancies as mobile dopants may comprise a combination of AlN and $AlN_{1-x}$ in at least one programmed state depending on location of the nitrogen vacancies and the quantity of the nitrogen vacancies in the locations where such are received. In such embodiment, lateral region 24 may or may not comprise AlN having lower density of or no nitrogen vacancies in comparison to lateral region 22.

In one embodiment, lateral region 22 that comprises fluorine vacancies as mobile dopants may comprise a combination of $MgF_2$ and $MgF_{2-x}$ in at least one programmed state depending on location of the fluorine vacancies and the quantity of the fluorine vacancies in the locations where such are received. In such embodiment, lateral region 24 may or may not comprise $MgF_2$ having lower density of or no fluorine vacancies in comparison to lateral region 22.

In one embodiment, the mobile dopants comprise aluminum atom interstitials in a nitrogen-containing material. In one embodiment, the mobile dopants comprise Cu atoms or ions in any of $HfO_2$, $ZrO_2$, $GeO_x$, and $SiO_2$. In one embodiment, the mobile dopants comprise Ag in amorphous silicon and/or chalcogen glasses (i.e., GeS and/or GeSe).

Material 16 may be of any suitable thickness T and of any suitable lateral width W that may be dependent upon composition of surrounding material such as dielectric, upon composition of the mobile dopants, if present, within said surrounding material, and/or upon the quantity of mobile dopants present in said surrounding material. Dimensions T and W, respectively, may be constant (as shown) or may be variable. Regardless, in one embodiment, the resistance switchable material has a minimum elevational thickness that is at least twice as great as its minimum lateral width. Example thicknesses T include from about 50 nanometers to about 150 nanometers, with an example width W being no greater than 25 nanometers. In one embodiment where memory cell 10 is in the "off" or "0" state of FIG. 1, a very high electric field would be required in the T oriented direction for current to flow between opposing electrodes 12 and 14 upon application of suitable differential voltage to electrodes 12 and 14. In one embodiment, such required field is at least 50 megavolts/meter, and in one embodiment is at least 500 megavolts/meter.

FIG. 1 depicts memory cell 10 in a high or highest resistance state, while FIG. 2 depicts memory cell 10 in a low or lowest resistance state. Resistance switchable material 22 in the lowest resistance state of FIG. 2 comprises a conductive channel/filament 26 which is localized along only one of the two laterally opposing edges 18, 20 and extends toward and away from first and second electrodes 12 and 14. Conductive channel 26 may or may not contact at least one of conductive electrodes 12 and 14, with the embodiment of FIG. 2 showing such conductive channel contacting each of first conductive electrode 12 and second conductive electrode 14. Regardless, conductive channel 26 may or may not be of constant lateral width along its length. FIG. 2 depicts an embodiment wherein conductive channel 26 is of constant lateral width along its length. As an example where channel/region 26 comprises oxygen vacancies as mobile dopants that are received in surrounding $TiO_2$, an overall average oxygen vacancy density greater than $5 \times 10^{18}$ vacancies/cm$^3$ may render region/channel 26 electrically conductive.

Conductive channel 26 may have constant conductivity per unit length of channel 26 between first and second electrodes 12 and 14 (i.e. the same conductivity along all of the shortest straight-line distance between electrodes 12 and 14.) Such is exemplified in FIG. 2 by the depicted constant density of stippling within region 26 between electrodes 12 and 14. FIG. 3 depicts an alternate embodiment low or lowest resistance state memory cell 10a. Like numerals from the above-described embodiments have been used where appropriate, with some construction differences being indicated with the suffix "a". In FIG. 3, conductive channel 26a has greater conductivity per unit length of channel 26a more proximate one of the first and second electrodes (i.e., electrode 12) than proximate the other of the first or second electrodes (i.e., electrode 14). Such is exemplified in FIG. 3 by the depicted greater density of stippling proximate electrode 12 along some fractional amount of the shortest straight-line distance within region 26a between electrodes 12 and 14 than proximate electrode 14 along the same fractional amount.

FIGS. 2 and 3 depict embodiments wherein conductive channels 26 and 26a are each of some respective constant lateral width along their lengths.

FIG. 4 depicts an alternate embodiment low or lowest resistance state memory cell 10b where a conductive channel 26b has variable lateral width. Like numerals from the above-described embodiments have been used where appropriate, with some construction differences being indicated with the suffix "b". Additionally, FIG. 4 depicts an example embodiment wherein a conductive channel 26b is narrower more proximate one of the electrodes than it is proximate the other of the electrodes. Further in such embodiment where, for example, conductivity is achieved or increases due to greater mobile dopant density, conductive channel 26b may have constant conductivity per unit length analogous to the embodiment of FIG. 2 as described above and as shown.

FIG. 5 depicts an alternate embodiment low or lowest resistance state memory cell 10c where a conductive channel 26c has variable lateral width. Like numerals from the above-described embodiments have been used where appropriate, with some construction differences being indicated with the suffix "c". FIG. 5 depicts an example embodiment wherein conductive channel 26c has greater conductivity per unit length more proximate one of the first and second electrodes than proximate the other of the first or second electrodes analogous to the embodiment of FIG. 3 as described above and as shown. Regardless, FIGS. 4 and 5 also depict embodiments wherein the conductive formed channels have a respective tapered or wedge-like shape. The embodiments of FIGS. 2-5 may be programmed back to the FIG. 1 state, or to some other state(s).

The above-depicted embodiments show first and second lateral regions 22, 24 being of different composition relative one another in the programmed state of FIG. 1 and in the programmed states of FIGS. 2-5. FIG. 6 depicts an alternate example embodiment memory cell 10d (in a low or lowest resistance state) having a substantially homogenous resistance switchable material 16d that is capable of being repeatedly programmed to at least two different resistance states. Like numerals from the above-described embodiments have been utilized where appropriate, with some construction differences being indicated with the suffix "d". Memory cell 10d of FIG. 6 may be programmed to a low or lowest resistance state which comprises a conductive channel (not shown) as described above in connection with the embodiments of FIGS. 2-5, and then programmed back to the FIG. 6 state, or to some other state(s). Accordingly, the embodiment of FIG. 6 may also be repeatedly programmed between lower or lowest resistance states and higher or highest resistance states.

In one embodiment, a method of programming a memory cell comprising a pair of opposing conductive electrodes having resistance switchable material received there-between includes application of an electric field through the resistance switchable material. Such field is applied in a prevailingly laterally oriented direction to cause mobile dopants within the resistance switchable material to move laterally toward or away from one of the opposing lateral edges of the resistance switchable material to change resistance between the pair of electrodes. A prevailingly laterally oriented direction does not have to be entirely lateral and accordingly may include other directional components in the field. The resistance switchable material retains the changed resistance state after the applied electric field is removed. FIGS. 1-6, by way of example only, depict such embodiments wherein the programmed states of FIGS. 1 and 6 constitute one state, and the programmed states of FIGS. 2-5 constitute another respective different resistance state.

Figure 7:
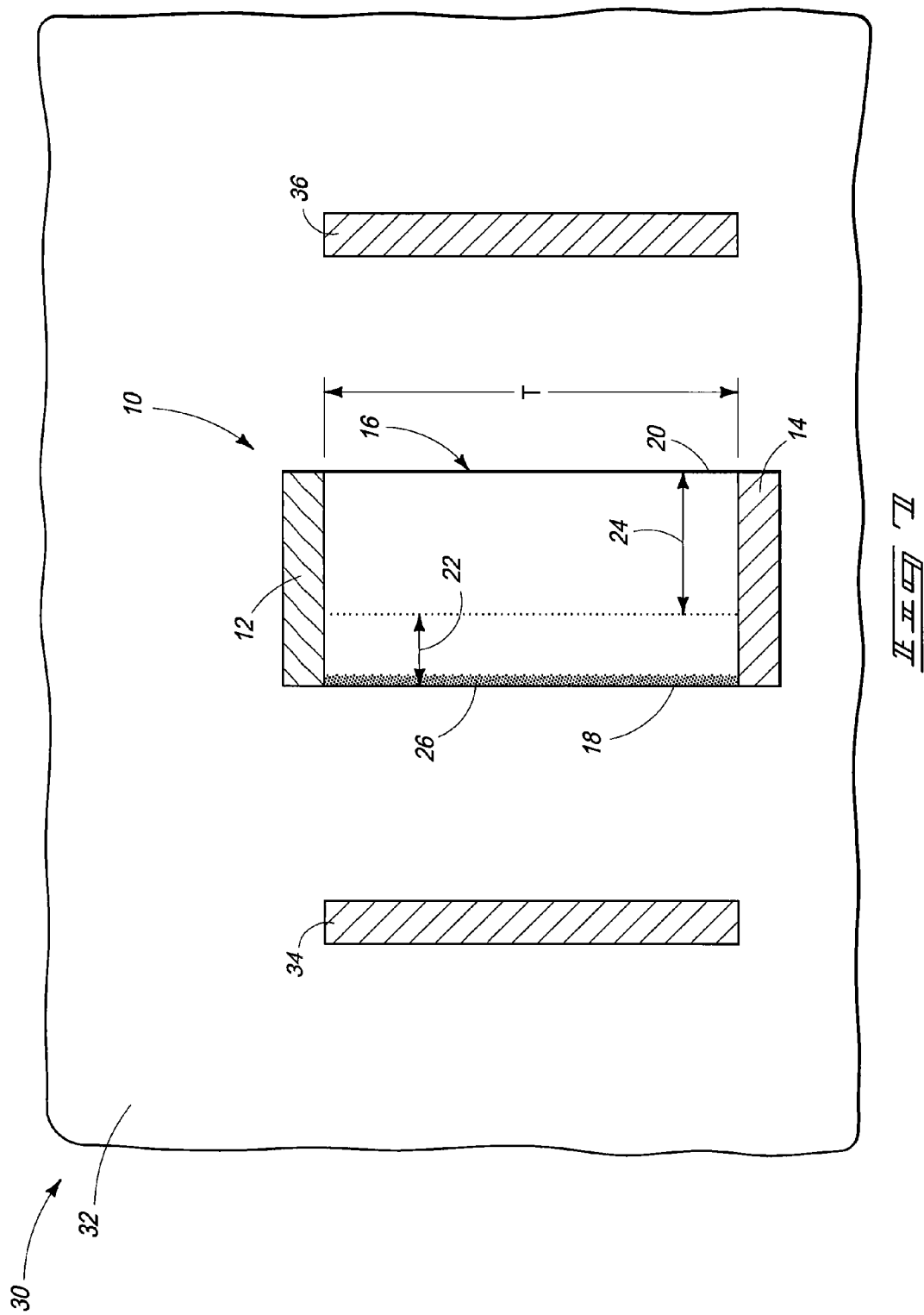
FIG. 7 is a diagrammatic sectional view of a memory cell in accordance with an embodiment of the invention.

In one embodiment, the application of the electric field comprises applying a voltage differential across two additional conductive electrodes which are received laterally of opposing sides of the pair of opposing conductive electrodes, with the two additional conductive electrodes being electrically insulated from the pair of opposing conductive electrodes at least during the application of the electric field. An example circuit capable of such operation is diagrammatically shown in a construction 30 in FIG. 7. Like numerals from the above-described embodiments have been used where appropriate, with differences being indicated with different numerals. Circuit construction 30 comprises memory cell 10 and two additional electrodes 34, 36 received within a dielectric material 32. In one embodiment, electrodes 34 and 36 may be considered as third and fourth electrodes. Dielectric material 32 may be homogenous or non-homogenous, with silicon dioxide being but one example. Conductive electrodes 34 and 36 may be of the same or different compositions and constructions relative to each other and/or electrodes 12 and 14. Example additional electrodes 34 and 36 are received laterally of opposing sides of conductive electrodes 12 and 14 and laterally of opposing sides of material 16. FIG. 7 depicts an embodiment wherein conductive electrodes 34, 36 elevationally overlap thickness expanse T of resistance switchable material 16. Additionally in the FIG. 7 embodiment, conductive electrodes 34, 36 are elevationally coincident with thickness expanse T of resistance switchable material 16.

FIG. 7 depicts an embodiment wherein an electric field has been applied to the memory cell embodiment of FIG. 1 to move the mobile dopants laterally toward edge 18 to form conductive channel 26. In one embodiment, the composition and lateral width of material 16 is chosen to enable a prevailing laterally oriented electric field of no greater than 25 megavolts/meter to be used to repeatedly program memory cell 10 between the example programmed state depicted by FIG. 1 and that depicted by any of FIGS. 2-5 and 7. Such may be achieved by applying alternating differential read and write voltages across or between electrodes 34 and 36.

The applied voltages may be determined by a person of skill in the art, and will be impacted by the composition of material 32, composition of material 16, composition and quantity of mobile dopants therein, lateral thickness of material 16, and/or distances of electrodes 34 and 36 from material 16. In one embodiment, an example required prevailing laterally oriented electric field to cause suitable programming mobile dopant movement is no greater than 2 megavolts/meter, and in one embodiment no greater than 0.5 megavolts/meter. Regardless, the applied electric field need not be the same for writing towards one resistance state and back to the original resistance state. For example, and in one embodiment, at least 0.3 megavolts/meter may be used laterally across material 16 to achieve the programmed state of FIGS. 2 and 7, whereas programming from the FIGS. 2 and 7 state (or from a FIGS. 3-5 state) back to that of the FIG. 1 state may only require an electric field of 0.15 megavolts/meter. As an example, a positive voltage of V/2 may be applied to one of electrodes 34 or 36 and a negative voltage of V/2 applied to the other of electrodes 34 and 36 to change from one resistance state to the other. The positive/negative relationship of such applied voltage could be reversed to program from the other to the one. Alternately or additionally, the voltages need not be of the same magnitude and/or need not be of different sign. Further and regardless, one or more differential write voltages for memory cell 10 associated with electrodes 34 and 36 may be the same or different from a differential read voltage applied across or between electrodes 12 and 14. For example, a differential read voltage may be 2.5 volts wherein one or more differential write voltages may be on the order of 5.0 volts. Other programming and read voltages may of course be used.

External voltage may or may not be applied to one or both of electrodes 12 and 14 during application of the electric field through resistance switchable material 16 in a prevailing laterally oriented direction. In one embodiment, the opposing conductive electrodes 12 and 14 are pulled to substantially the same voltage during application of such electric field. In one embodiment, each of the pair of opposing conductive electrodes 12 and 14 is pulled to 0V during application of such electric field. In one embodiment, no external voltage is applied to the pair of opposing conductive electrodes during application of such electric field. In other words, voltage of the pair of opposing conductive electrodes in such example may be allowed to float.

As used herein, pulling a conductive electrode to a voltage refers to causing the conductive electrode to be at or very close to the voltage. The voltage may be positive or negative and may have substantially any magnitude. In pulling a conductive electrode to a voltage, it is to be understood that individual voltages measured at various locations of the conductive electrode might not be exactly the same due to, for example, the resistance of the conductive electrode itself. However, the individual voltages may be substantially the same since the individual voltages may be as close to the voltage as the physical limitations of the conductive electrode will allow.

Figure 8B:
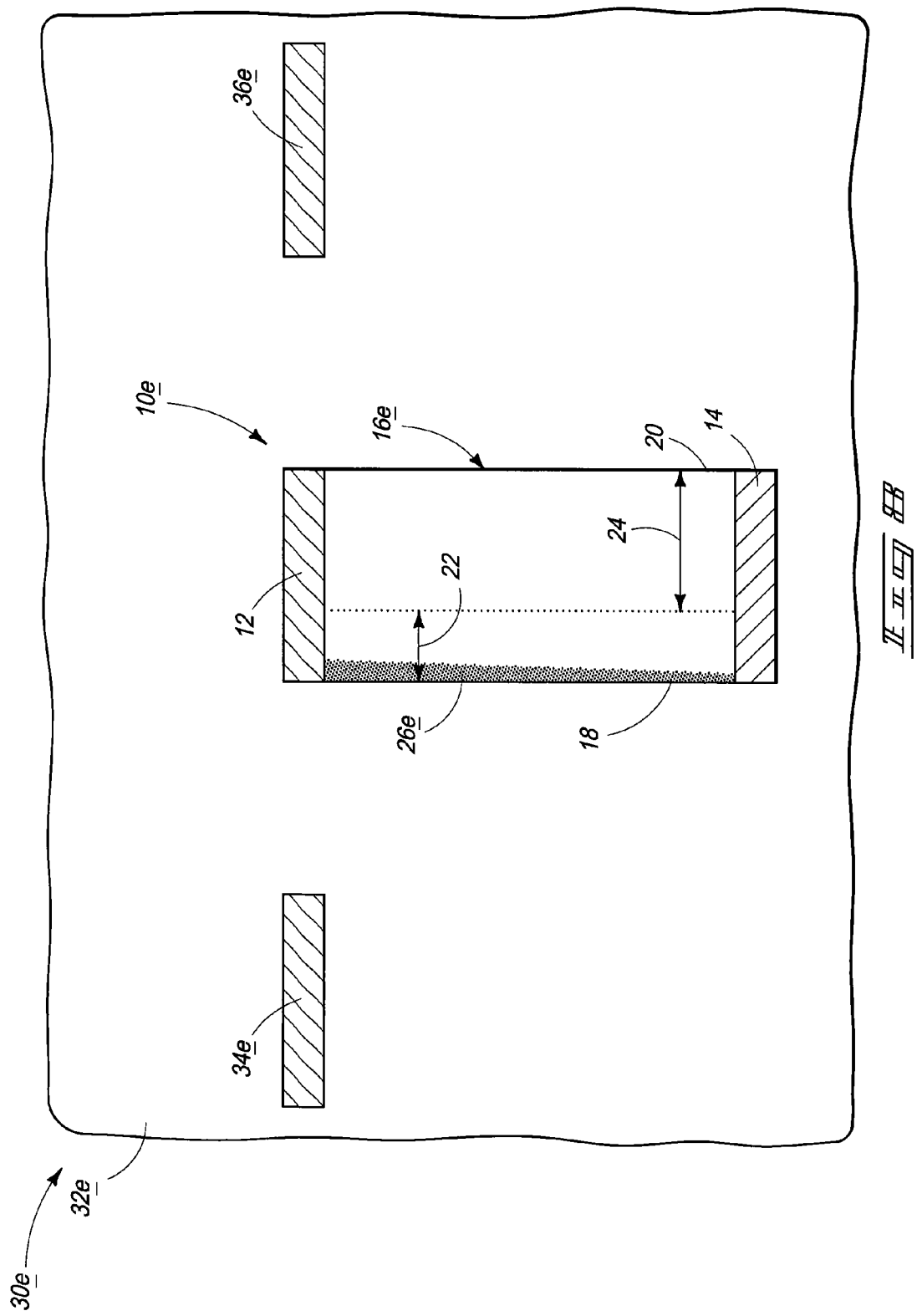
FIG. 8 is a diagrammatic sectional view of a memory cell in accordance with an embodiment of the invention.

FIG. 8 depicts an alternate example embodiment circuit construction 30e. Like numerals from the above-described embodiments have been used where appropriate, with some construction differences being indicated with the suffix "e". FIG. 8 depicts a construction 30e wherein additional conductive electrodes 34e and 36e are received elevationally away (meaning no elevational overlap) from resistance switchable material 16. Alternately, some elevational overlap may occur. Application of an electric field to the embodiment of FIG. 8 as described above in connection with FIGS. 4 and 5 may result in such field being stronger more proximate conductive electrode 12 than conductive electrode 14, and may result in a tapered or wedged-shaped conductive channel 26e analogous to conductive channel 26b in FIG. 4. Alternately and by way of example only, a conductive channel may form having the configuration of either of FIGS. 3 and 5.

An embodiment of the invention encompasses writing to and reading from a cross point memory cell of an array of cross point memory cells. A portion of a non-volatile cross point memory array is indicated generally with reference numeral 40 in top view in FIG. 9. Such array includes a plurality of word lines WL1-WL4 and a plurality of bit lines BL1-BL4 crossing the plurality of word lines. The array further includes a plurality of memory cells M11-M44 represented symbolically by circles. The memory cells individually correspond to a different one of the crossings of the plurality of word lines and the plurality of bit lines relative to one another. For example, memory cell M12 corresponds to the crossing of WL1 and BL2 and memory cell M34 corresponds to the crossing of WL3 and BL4. The portion illustrated in FIG. 9 may be a very small portion of the non-volatile memory array. In addition to the word lines, bit lines, and memory cells illustrated in FIG. 9, the non-volatile memory array may include many word lines, bit lines, and memory cells.

Figure 9:
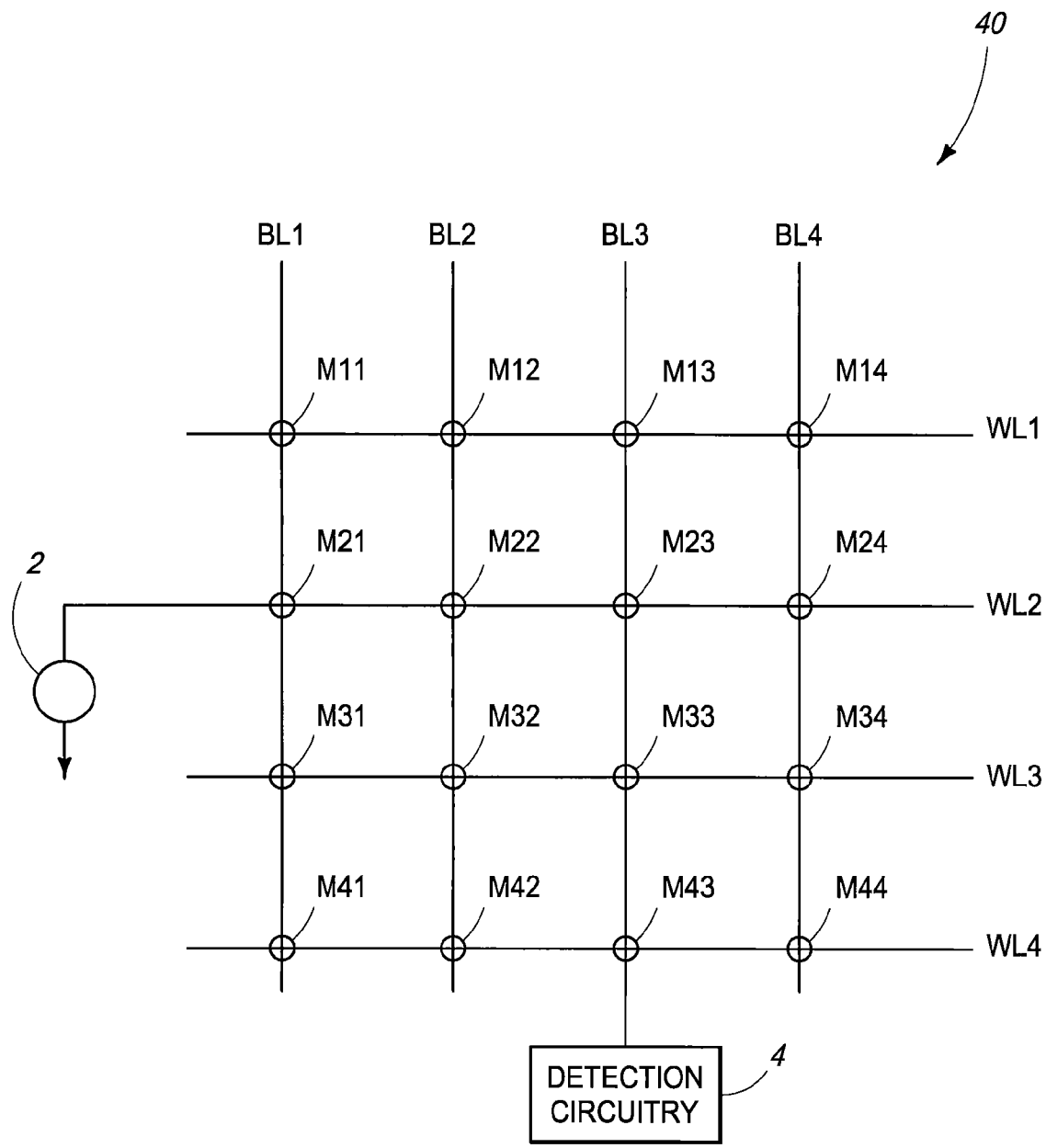
FIG. 9 is a diagrammatic schematic of a portion of a non-volatile memory array in accordance with an embodiment of the invention.

Although the word lines and bit lines of FIG. 9 are shown as being straight lines which orthogonally cross relative one another, other shapes and angles of intersection, whether existing or yet-to-be developed, may be used. The bit lines and word lines of FIG. 9 are diagrammatically and schematically shown in FIG. 9 as touching one another where such intersect, although such would not be ohmically connected relative to the depicted intersection.

In one embodiment, a method of writing to and reading from a cross point memory cell of array 40 includes writing to a memory cell by applying a differential write voltage between the two immediately adjacent bit lines which are on opposing lateral sides of the memory cell being written to. Reading from such memory cell occurs by applying a differential read voltage between the crossing word line and the crossing bit line of such memory cell and sensing current resulting from the applying of the read voltage. The two immediately adjacent bit lines may be electrically insulated from the memory cell. The differential read voltage and the differential write voltage may be the same or different from one another. Regardless, in one embodiment, the individual memory cells comprise resistance switchable material received between the crossing word lines and bit lines. In such embodiment, the writing comprises switching the resistance of the resistance switchable material between at least two different resistance states which statically remains in a programmed resistance state until programmed to a different resistance state. In one embodiment, the writing comprises causing mobile dopants within the resistance switchable material to move laterally toward or away from one of opposing lateral edges of the resistance switchable material. In one embodiment, the writing moves the mobile dopants toward the one lateral edge to form a conductive channel which is localized along the one lateral edge. In one embodiment where such a conductive channel exists, the writing moves the mobile dopants away from the one lateral edge to remove the conductive channel.

Figure 10:
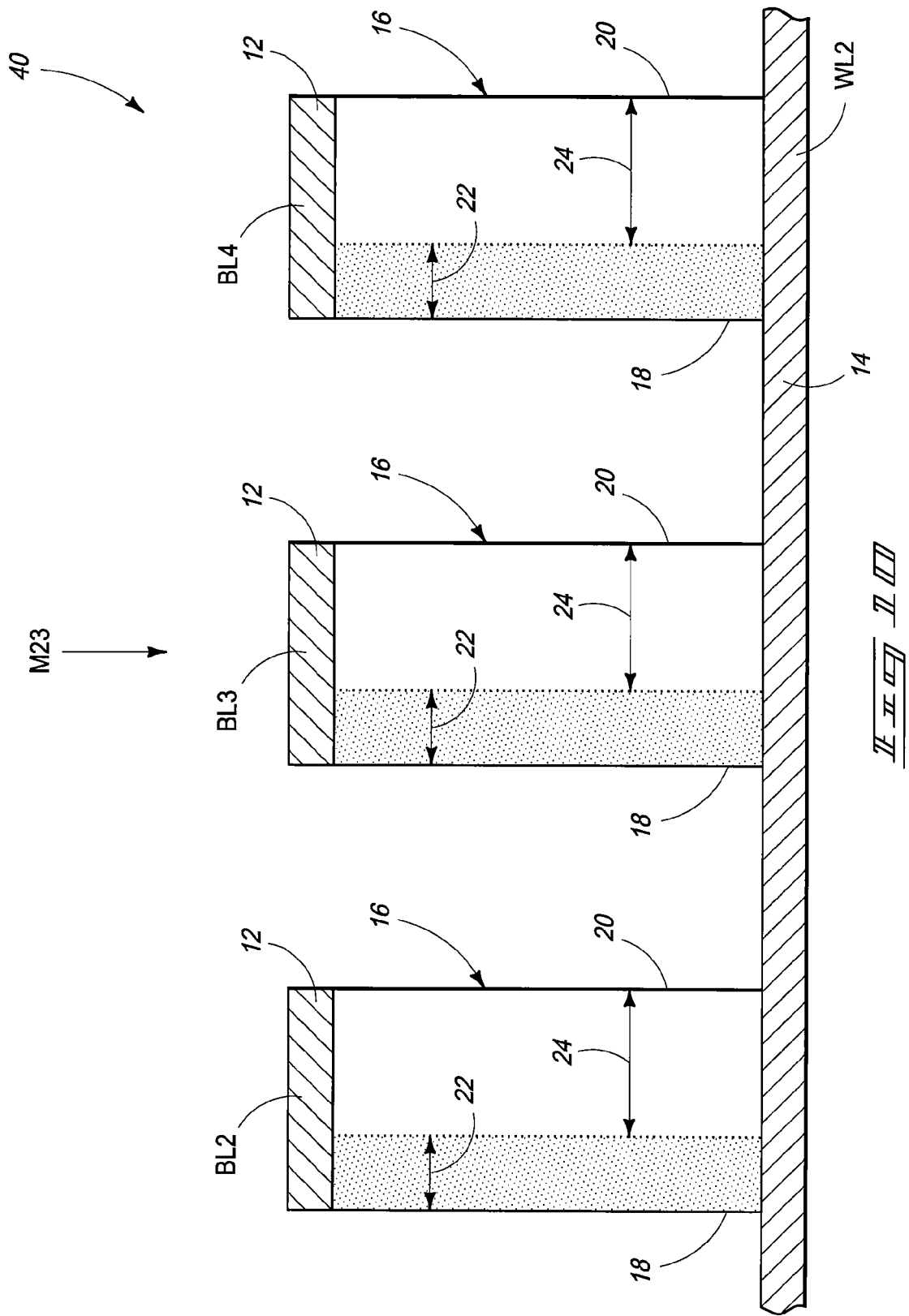
FIG. 10 is a diagrammatic sectional view as would be taken along WL2 and through BL2, BL3, and BL4 of an example circuit construction in one programmed state in accordance with an embodiment of the invention.
Figure 11:
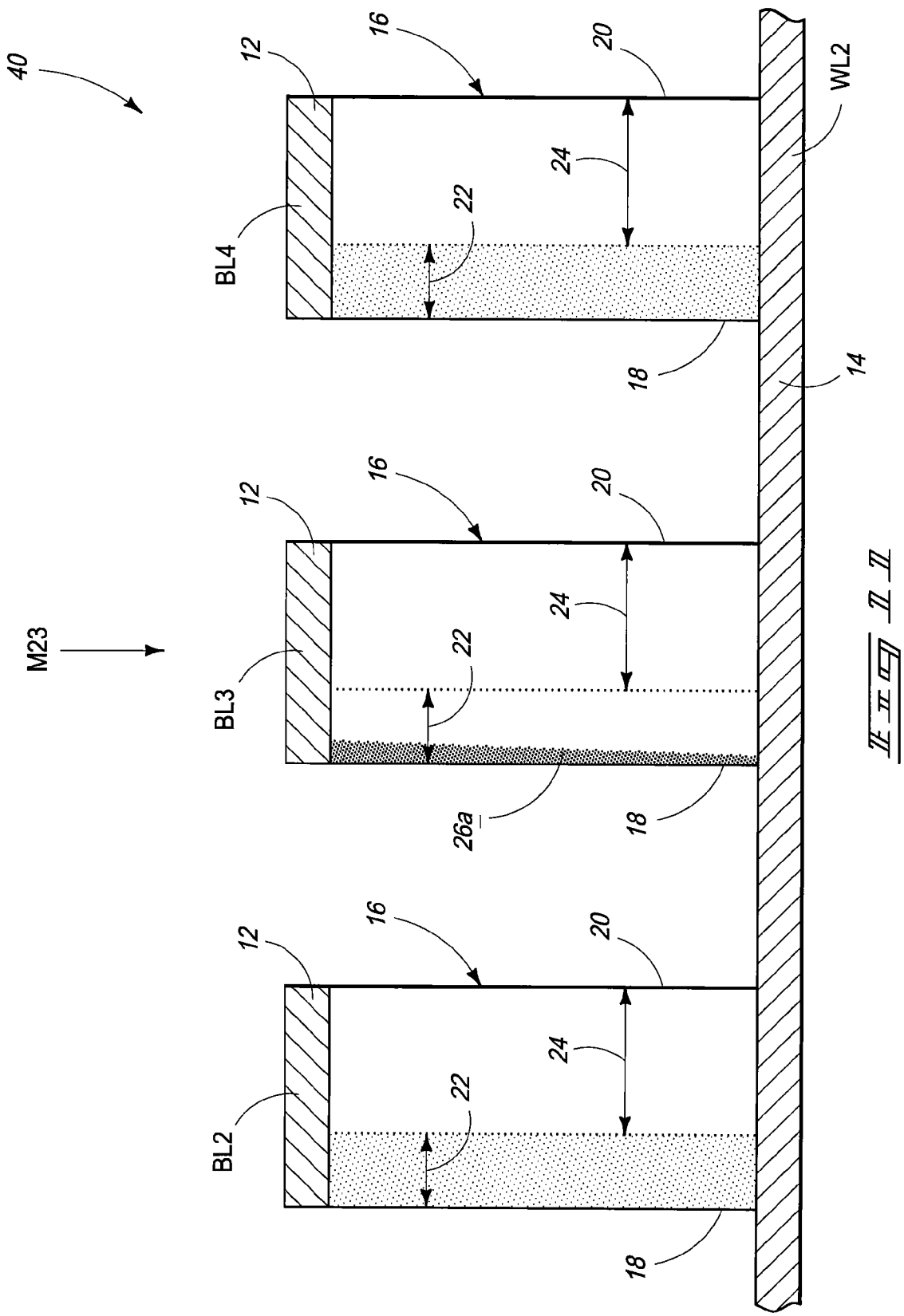
FIG. 11 is view of the FIG. 8 circuit in another programmed state in accordance with an embodiment of the invention.

FIGS. 10 and 11 depict example cross sectional circuit constructions of array 40 of FIG. 9 as would be taken through line WL2 through BL2, BL3, and BL4. FIG. 10 depicts an example higher or highest resistance state for memory cell M23, while FIG. 11 depicts memory cell M23 at a lower or lowest resistance state. Such programmed states may be achieved, by way of example only, in connection with any of the programming methods (and resultant conductive channels) described above with respect to FIG. 8. Regardless, in producing the programmed state of FIG. 11, the writing may form the conductive channel to be of constant lateral width between the crossing word line and bit line of the memory cell, or to be of variable width (as shown). Any of the conductive channel constructions of FIGS. 2-5, or some other conductive channel construction, may result, with the construction of FIG. 4 being shown by way of example only.

In one embodiment, no external voltages are applied to the crossing word line WL2 and bit line BL3 of memory cell M23 during the act of writing from either the FIG. 10 state to the FIG. 11 state, or from the FIG. 11 state to the FIG. 10 state, or between any other pair of states. In one embodiment during the writing, a voltage is applied to at least some other word lines other than the crossing word line (WL2) of the memory cell (M23) and that is different from any voltage that is applied to the crossing word line (WL2). In one embodiment, such applying of the voltage to at least some other word lines results in an electric field component directionally different from an electric field component resulting from applying of the differential write voltage. In one embodiment, such applying of the voltage to at least some other word lines prevents other memory cells associated with the other word lines from being written to by the differential write voltage.

It may be desirable when writing to produce either or both of the FIG. 10 state or the FIG. 11 state (or any other state) to write only to a single memory cell which is received between example immediately adjacent bit lines BL2 and BL4 that are on opposing lateral sides of bit line BL3. Such may be achieved by assuring that any electric field applied to material 16 of other memory cells is not prevailing in a laterally oriented direction and/or is sufficiently weak if in a lateral direction to not cause the mobile dopants to laterally move while programming the one desired memory cell being programmed. Such may be accomplished, by way of example only, by application of a suitable differential voltage across material 16 of all the other memory cells that are received between the immediately adjacent bit lines to which the programming differential voltage is applied. By way of example only, consider a case where it is desired to change the programmed state of memory cell M23 and no other memory cell between bit lines BL2 and BL4. To accomplish such, word line WL2 may be provided or held at 0V while all of the other word lines WL1 and WL3-WLn are provided at some other suitable voltage which effectively applies an additional electric field component through material 16 in all memory cells but M23. For example, this additional electric field component may be vertically oriented in the example depicted cross section whereby no resultant or combinational electric field prevails laterally sufficiently to cause mobile dopants to move laterally, or at least not to move laterally sufficiently to create a path of conductance. Thereby, memory cell M23 is programmed whereas the other memory cells between programming bit lines BL2 and BL4 are not so programmed.

Alternately by way of example, all memory cells between bit lines BL2 and BL4 may be programmed by providing each word line at 0V or other suitable voltage during application of programming voltage to bit lines BL2 and BL4. Alternately, a selected plurality other than all of the memory cells between bit lines BL2 and BL4 may be programmed depending in part upon voltage potential applied to their respective crossing word lines WL. Regardless, in one embodiment, the writing is conducted simultaneously to multiple memory cells received between the pair of immediately adjacent bit lines which are conducting the programming. In one embodiment during writing, external voltage is applied to at least some other word lines other than the crossing word line of the particular memory cell being programmed and that is different from any voltage that is applied to such crossing word line.

Embodiments of the invention may include reading from a memory cell by applying a differential read voltage between the crossing word line and the crossing bit line of the memory cell and sensing current resulting from the applying of the read voltage. For example, reading may include applying a voltage using a voltage source 2 (FIG. 9) between a word line and bit line, and sensing current resulting from the application of such voltage. Detection circuitry 4 may be provided to sense the current and may, based on the current, determine a resistance state in which the memory cell is in and therefore the value of data stored by the memory cell. For example, in one embodiment, voltage source 2 may be connected to word line WL2 and detection circuitry 4 may be connected to bit line BL3 to determine the value of data stored by memory cell M23 by determining the resistance state of memory cell M23.

In FIGS. 10 and 11, the field depends on voltage applied over distance. The net field in the horizontal or lateral direction is dependent on distances between or among BL2, BL3, and BL4. The field in the vertical direction depends on the distance between the BL and WL. The height (thickness) of the memory cell versus spacing between the cells may be optimized to result in maximum field in the lateral direction and minimize the chance of high field across any other cells (BL to WL) which could lead to undesirable high field across unselected cells. Additionally in a three-dimensional cross point array where there is a deck/level of memory cells both above and below the deck in which programming is occurring, additional options may be used. For example, the decks above and below the deck being programming may be provided at suitable opposite sign voltages during programming.

An embodiment of the invention includes a non-volatile memory array comprising a plurality of word lines and a plurality of bit lines which cross the plurality of word lines. The array includes a plurality of memory cells which individually correspond to a different one of the crossings of the plurality of word lines and the plurality of bit lines relative to one another. The memory cells individually comprise resistance switchable material that is received between the word lines and the bit lines where such cross, and which is capable of being repeatedly programmed to at least two different resistance states. The resistance switchable material of at least one of the memory cells comprises a conductive channel localized along only one of two laterally opposing edges of such at least one memory cell and extends toward and away from the crossing word line and bit line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of programming a memory cell comprising a pair of opposing conductive electrodes having resistance switchable material received there-between, comprising:
  applying an electric field through the resistance switchable material in a prevailingly laterally oriented direction to cause mobile dopants within the resistance switchable material to move laterally toward or away from one of opposing lateral edges of the resistance switchable material to change resistance between the pair of electrodes, the resistance switchable material retaining the changed resistance after said applied electric field is removed.

2. The method of claim 1 wherein the applying of the electric field comprises applying a voltage differential across two additional conductive electrodes received laterally of opposing sides of the pair of opposing conductive electrodes, the two additional conductive electrodes being electrically insulated from the pair of opposing conductive electrodes during the applying of the electric field.

3. The method of claim 2 wherein the two additional conductive electrodes across which said voltage differential is applied are received elevationally away from the resistance switchable material.

4. The method of claim 2 wherein the two additional conductive electrodes across which said voltage differential is applied elevationally overlap the resistance switchable material.

5. The method of claim 4 wherein the two additional conductive electrodes across which said voltage differential is applied are elevationally coincident with the resistance switchable material.

6. The method of claim 1 wherein the opposing conductive electrodes of the pair are pulled to substantially the same voltage during said applying.

7. The method of claim 6 wherein each of the pair of opposing conductive electrodes is pulled to 0V during said applying.

8. The method of claim 1 wherein no external voltage is applied to the pair of opposing conductive electrodes during said applying.

9. A method of writing to and reading from a cross point memory cell of an array of cross point memory cells comprising a plurality of word lines and a plurality of bit lines crossing the plurality of word lines, individual of the cross point memory cells comprising a different one of the crossings of the plurality of word lines and the plurality of bit lines relative to one another, the method comprising:
  writing to a memory cell by applying a differential write voltage between the two immediately adjacent bit lines which are on opposing lateral sides of said memory cell; and
  reading from the memory cell by applying a differential read voltage between the crossing word line and the crossing bit line of the memory cell and sensing current resulting from the applying of the read voltage.

10. The method of claim 9 wherein the two immediately adjacent bit lines are electrically insulated from the memory cell.

11. The method of claim 9 wherein the differential read voltage and the differential write voltage are different from one another.

12. The method of claim 9 wherein the individual memory cells comprise resistance switchable material received between the crossing word lines and bit lines, the writing comprising switching the resistance of the resistance switchable material between at least two different resistance states which statically remains in a programmed resistance state until programmed to a different resistance state.

13. The method of claim 12 wherein the writing comprises causing mobile dopants within the resistance switchable material to move laterally toward or away from one of opposing lateral edges of the resistance switchable material.

14. The method of claim 13 wherein the writing moves the mobile dopants toward the one lateral edge to form a conductive channel which is localized along the one lateral edge.

15. The method of claim 14 wherein the writing forms the conductive channel to be of constant lateral width between the crossing word line and bit line of the memory cell.

16. The method of claim 15 wherein the writing forms the conductive channel to be of constant conductivity per unit length of the channel between the crossing bit line and crossing word line of the memory cell.

17. The method of claim 15 wherein the writing forms the conductive channel to be more conductive per unit length of the channel more proximate the crossing bit line of the memory cell than proximate the crossing word line of the memory cell.

18. The method of claim 14 wherein the writing forms the conductive channel to be of variable lateral width between the crossing word line and bit line of the memory cell.

19. The method of claim 18 wherein the writing forms the conductive channel to be wider more proximate the crossing bit line of the memory cell than proximate the crossing word line of the memory cell.

20. The method of claim 19 wherein the writing forms the conductive channel to be of constant conductivity per unit length of the channel between the crossing bit line and crossing word line of the memory cell.

21. The method of claim 19 wherein the writing forms the conductive channel to be more conductive per unit length of the channel more proximate the crossing bit line of the memory cell than proximate the crossing word line of the memory cell.

22. The method of claim 18 wherein the writing forms the lateral width of the conductive channel to taper.

23. The method of claim 13 wherein,
  the resistance switchable material comprises a conductive channel of the mobile dopants which is localized along the one lateral edge; and the writing moves the mobile dopants away from the one lateral edge to remove the conductive channel.

24. The method of claim 9 wherein the writing is simultaneously to multiple memory cells received between said pair of immediately adjacent bit lines.

25. The method of claim 9 further comprising during the writing, applying a voltage to at least some other word lines other than the crossing word line of the memory cell and that is different from any voltage that is applied to the crossing word line.

26. The method of claim 25 wherein the applying of the voltage to at least some other word lines results in an electric field component directionally different from an electric field component resulting from applying of the differential write voltage.

27. The method of claim 25 wherein the applying of the voltage to at least some other word lines prevents other memory cells associated with the other word lines from being written to by the differential write voltage.

28. A method of writing to cross point memory cells of an array of cross point memory cells comprising a plurality of word lines and a plurality of bit lines crossing the plurality of word lines, individual of the cross point memory cells comprising a different one of the crossings of the plurality of word lines and the plurality of bit lines relative to one another, the method comprising:
  writing to a memory cell by applying a differential write voltage between the two immediately adjacent bit lines which are on opposing lateral sides of said memory cell.

29. The method of claim 28 comprising simultaneously writing to multiple memory cells received between said two immediately adjacent bit lines.

30. A memory cell comprising:
  first and second opposing electrodes having resistance switchable material received there-between, the resistance switchable material being capable of being repeatedly programmed to at least two different resistance states, the resistance switchable material in a lowest resistance state comprising a conductive channel localized along only one of two laterally opposing edges of the resistance switchable material and extending toward and away from the first and second electrodes.

31. A non-volatile memory array comprising:
  a plurality of word lines;
  a plurality of bit lines crossing the plurality of word lines; and
  a plurality of memory cells individually corresponding to a different one of the crossings of the plurality of word lines and the plurality of bit lines relative to one another, the memory cells individually comprising resistance switchable material received between the word lines and the bit lines where such cross and which is capable of being repeatedly programmed to at least two different resistance states, the resistance switchable material of at least one of the memory cells comprising a conductive channel localized along only one of two laterally opposing edges of said at least one memory cell and extending toward and away from the crossing word line and bit line.

32. The memory cell of claim 30 wherein the conductive channel contacts at least one of the first and second conductive electrodes.

33. The memory cell of claim 32 wherein the conductive channel contacts each of the first and second conductive electrodes.

34. The memory cell of claim 30 wherein the resistance switchable material has a minimum elevational thickness that is at least twice as great as its minimum lateral width.

35. The memory cell of claim 30 wherein the conductive channel is of constant lateral width.

36. The memory cell of claim 35 wherein the conductive channel has constant conductivity per unit length of the channel between the first and second electrodes.

37. The memory cell of claim 35 wherein the conductive channel has greater conductivity per unit length of the channel more proximate one of the first and second electrodes than proximate the other of the first and second electrodes.

38. The memory cell of claim 30 wherein the conductive channel is of variable lateral width.

39. The memory cell of claim 38 wherein the conductive channel has constant conductivity per unit length of the channel between the first and second electrodes.

40. The memory cell of claim 38 wherein the conductive channel has greater conductivity per unit length of the channel more proximate one of the first and second electrodes than proximate the other of the first and second electrodes.

41. The memory cell of claim 38 wherein the conductive channel is narrower and more conductive proximate one of the electrodes than it is proximate the other electrode.

42. The memory cell of claim 30 comprising a cross point memory cell, one of the opposing electrodes comprising a word line extending in a first direction, the other of the opposing electrodes comprising a bit line extending in a second direction different from the first direction.

43. The memory cell of claim 42 wherein the conductive channel is wider more proximate the bit line than proximate the word line.

* * * * *